United States Patent
Lee et al.

(10) Patent No.: US 11,985,873 B2
(45) Date of Patent: May 14, 2024

(54) DISPLAY DEVICE

(71) Applicant: Samsung Display Co., Ltd., Yongin-si (KR)

(72) Inventors: Dongyoub Lee, Yongin-si (KR); Heejin Kim, Yongin-si (KR); Kitae Kim, Yongin-si (KR); Juhyun Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 300 days.

(21) Appl. No.: 17/444,401

(22) Filed: Aug. 4, 2021

(65) Prior Publication Data

US 2022/0190092 A1   Jun. 16, 2022

(30) Foreign Application Priority Data

Dec. 11, 2020  (KR) .......................... 10-2020-0173682

(51) Int. Cl.
*H10K 59/131*  (2023.01)
*H10K 59/40*   (2023.01)

(52) U.S. Cl.
CPC .......... *H10K 59/131* (2023.02); *H10K 59/40* (2023.02)

(58) Field of Classification Search
CPC .... H10K 59/131; H10K 59/40; H10K 50/844; H10K 59/124; H10K 59/12; H10K 59/129; G06F 3/0412; G09G 3/3225
See application file for complete search history.

(56) References Cited

U.S. PATENT DOCUMENTS

| | | |
|---|---|---|
| 6,362,087 B1 | 3/2002 | Wang et al. |
| 6,531,384 B1 | 3/2003 | Kobayashi et al. |
| 7,741,714 B2 | 6/2010 | Huang et al. |
| 8,791,575 B2 | 7/2014 | Oganesian et al. |
| 10,481,717 B2 | 11/2019 | Miyamoto |
| 10,739,892 B2 | 8/2020 | Shim et al. |
| 2018/0102083 A1 | 4/2018 | So et al. |
| 2019/0163304 A1* | 5/2019 | Shim ................... H01L 27/124 |
| 2020/0105858 A1 | 4/2020 | Son et al. |

FOREIGN PATENT DOCUMENTS

| | | |
|---|---|---|
| CN | 1770437 A | 5/2006 |
| EP | 3496149 A1 | 6/2019 |
| JP | 2018-112690 A | 7/2018 |
| KR | 10-2008-0043068 A | 5/2008 |
| KR | 10-0896141 B1 | 5/2009 |
| KR | 10-1061867 B1 | 9/2011 |
| KR | 10-1742806 B1 | 6/2017 |
| KR | 10-2019-0064710 A | 6/2019 |
| KR | 10-2020-0037898 A | 4/2020 |

* cited by examiner

*Primary Examiner* — Kyoung Lee
(74) *Attorney, Agent, or Firm* — Lewis Roca Rothgerber Christie LLP

(57) ABSTRACT

A display device includes: a display area having a plurality of sub-pixels; a plurality of pad electrodes in a peripheral area outside the display area; a first organic insulating layer comprising an opening overlapping the plurality of pad electrodes; and an integrated circuit overlapping the plurality of pad electrodes and electrically connected to the plurality of pad electrodes, wherein a distance between an edge of the first organic insulating layer defining the opening and an edge of the integrated circuit is 40 micrometers (μm) or more.

17 Claims, 11 Drawing Sheets

DISPLAY DEVICE

CROSS-REFERENCE TO RELATED APPLICATION

This application claims priority to and the benefit of Korean Patent Application No. 10-2020-0173682, filed on Dec. 11, 2020, in the Korean Intellectual Property Office, the entire contents of which are hereby incorporated by reference.

BACKGROUND

1. Field

Aspects of one or more embodiments relate to a display device.

2. Description of the Related Art

Recently, display panels have been used for various purposes. Also, as thicknesses and weights of display panels have decreased, the range of applications for display panels has increased.

As the area occupied by a display area in a display panel increases, elements may be located in a relatively narrow peripheral area. When cracks occur according to the arrangement of the elements, the reliability of a display device may be reduced or display quality degradation may occur due to the cracks.

The above information disclosed in this Background section is only for enhancement of understanding of the background and therefore the information discussed in this Background section does not necessarily constitute prior art.

SUMMARY

Aspects of one or more embodiments include a display device with relatively improved reliability and relatively improved display quality.

Additional aspects will be set forth in part in the description which follows and, in part, will be more apparent from the description, or may be learned by practice of the presented embodiments.

According to one or more embodiments, a display device includes a display area in which a plurality of sub-pixels are located, a plurality of pad electrodes located in a peripheral area outside the display area, a first organic insulating layer including an opening overlapping the plurality of pad electrodes, and an integrated circuit overlapping the plurality of pad electrodes and electrically connected to the plurality of pad electrodes, wherein a distance between an edge of the first organic insulating layer defining the opening and an edge of the integrated circuit is about 40 μm or more.

According to some embodiments, the display device may further include a second organic insulating layer on the first organic insulating layer, wherein the second organic insulating layer extends past the edge of the first organic insulating layer to overlap a part of the integrated circuit.

According to some embodiments, the second organic insulating layer may include a first portion overlapping the first organic insulating layer, and a second portion extending past the edge of the first organic insulating layer to overlap a part of the integrated circuit, wherein a thickness of the second portion is less than a thickness of the first portion.

According to some embodiments, the second organic insulating layer may include a connected portion between the first portion and the second portion, the connection portion of the second organic insulating layer includes a stepped portion, and the stepped portion may be located on a top surface of the first organic insulating layer.

According to some embodiments, the distance may range from about 40 μm to about 80 μm.

According to some embodiments, the display device may further include a plurality of data lines passing through the display area, and a plurality of connection lines electrically connecting the plurality of data lines to the plurality of pad electrodes.

According to some embodiments, some of the plurality of connection lines may overlap the opening of the first organic insulating layer.

According to some embodiments, the display device may further include a touch input layer including a plurality of touch electrodes and a touch insulating layer located in the display area, wherein the touch insulating layer overlaps the second organic insulating layer.

According to some embodiments, the touch insulating layer may overlap the second portion of the second organic insulating layer.

According to some embodiments, the touch insulating layer may include at least one of an organic insulating material or an inorganic insulating material.

According to some embodiments, the plurality of sub-pixels may emit light by using a light-emitting diode located on a substrate, wherein a part of the first organic insulating layer is located between the substrate and the light-emitting diode.

According to one or more embodiments, a display device includes a display area in which a plurality of sub-pixels are located, a plurality of signal lines located in the display area, a plurality of pad electrodes located in a peripheral area outside the display area and electrically connected to the plurality of signal lines, a first organic insulating layer including an opening overlapping the plurality of pad electrodes, a second organic insulating layer on the first organic insulating layer, and an integrated circuit overlapping the plurality of pad electrodes and electrically connected to the plurality of pad electrodes, wherein an edge of the first organic insulating layer defining the opening is located outside the integrated circuit to be spaced apart from an edge of the integrated circuit.

According to some embodiments, a distance between the edge of the first organic insulating layer and the edge of the integrated circuit may range from about 40 μm to about 80 μm.

According to some embodiments, the second organic insulating layer may extend past the edge of the first organic insulating layer to overlap a part of the integrated circuit.

According to some embodiments, the second organic insulating layer includes a first portion overlapping the first organic insulating layer, and a second portion extending past the edge of the first organic insulating layer to overlap a part of the integrated circuit, wherein a thickness of the second portion is less than a thickness of the first portion.

According to some embodiments, the second organic insulating layer may include a connected portion between the first portion and the second portion, the connected portion of the second organic insulating layer includes a stepped portion, wherein the stepped portion is located opposite to the edge of the integrated circuit with the edge of the first organic insulating layer therebetween.

According to some embodiments, the display device may further include a plurality of connection lines electrically connecting data lines of the display area to the plurality of pad electrodes of the peripheral area, wherein the plurality of connection lines are located under the first organic insulating layer.

According to some embodiments, some of the plurality of connection lines may overlap the opening of the first organic insulating layer.

According to some embodiments, the plurality of sub-pixels may emit light by using a light-emitting diode located on a substrate, wherein each of a part of the first organic insulating layer and a part of the second organic insulating layer is located between the substrate and the light-emitting diode.

According to some embodiments, the display device may further include a touch input layer including a plurality of touch electrodes and a touch insulating layer located in the display area, wherein the touch insulating layer overlaps the first organic insulating layer and the second organic insulating layer.

Other features and characteristics of embodiments according to the present disclosure will become more apparent from the drawings, the claims, and the detailed description.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1A:
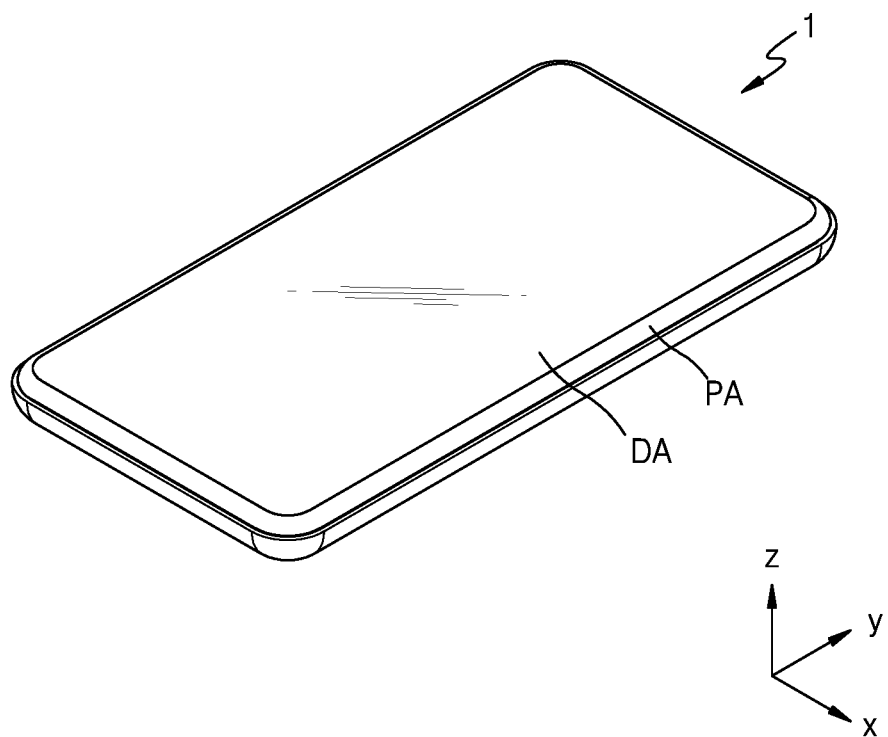
FIGS. 1A and 1B are perspective views illustrating a display device according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in more detail with reference to the drawings. However, the disclosure is not limited to the following embodiments and may be embodied in various forms.

Hereinafter, aspects of some embodiments will be described in more detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of elements in the drawings may be exaggerated or contracted for convenience of description. For example, because sizes and thicknesses of elements in the drawings are arbitrarily illustrated for convenience of description, the disclosure is not limited thereto.

When a certain embodiment may be implemented differently, a specific process order may be different from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when layers, areas, or elements are referred to as being "electrically connected," the layers, the areas, or the elements may be directly electrically connected, or may be indirectly electrically connected with intervening layers, areas, or elements therebetween.

"A and/or B" is used herein to select only A, select only B, or select both A and B.

Figure 1B:
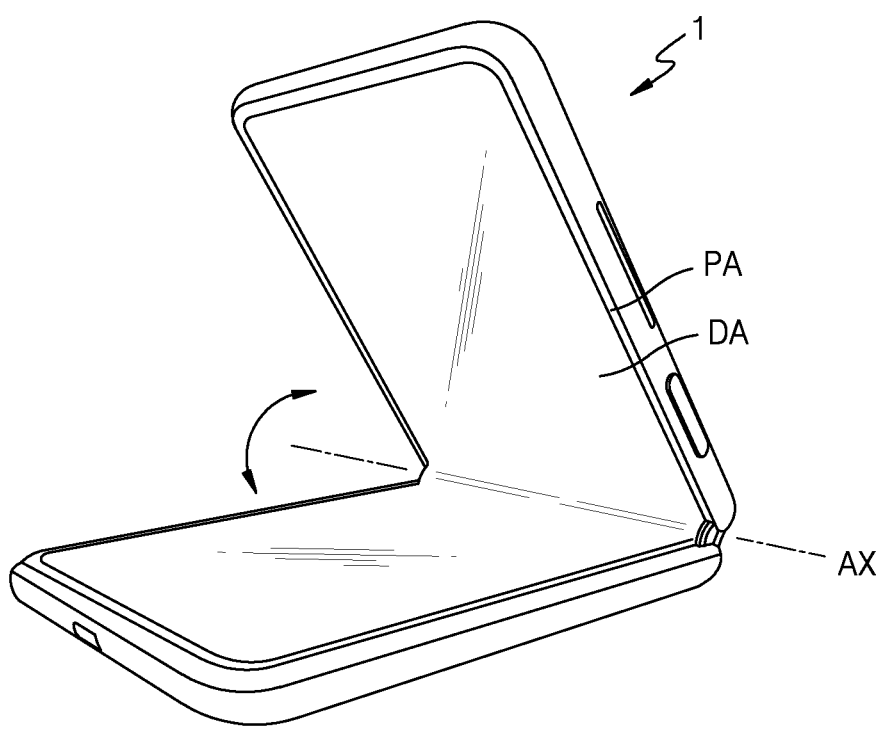

FIGS. 1A and 1B are perspective views illustrating a display device according to some embodiments.

Referring to FIGS. 1A and 1B, a display device 1 that is a device for displaying moving images (e.g., video images) or still images (e.g., static images) may be a portable electronic device such as a mobile phone, a smartphone, a tablet personal computer (PC), a mobile communication terminal, an electronic organizer, an electronic book, a portable multimedia player (PMP), a navigation device, or an ultra-mobile PC (UMPC). Alternatively, the display device 1 may be used as a display screen of any of various products such as a television, a notebook computer, a monitor, an advertisement board, or an Internet of Things (IOT) device. Also, the display device 1 according to some embodiments may be used in a wearable device such as a smart watch, a watch phone, a glasses-type display, or a head-mounted display (HMD). Also, the display device 1 according to some embodiments may be used as a center information display (CID) located on an instrument panel, a center fascia, or a dashboard of a vehicle, a room mirror display replacing a side-view mirror of a vehicle, or a display located on the back of a front seat for entertainment for a back seat of a vehicle. For convenience of description, the display device 1 according to some embodiments is a smartphone in FIGS. 1A and 1B.

The display device 1 may have a rectangular shape, in a plan view. For example, the display device 1 may have a rectangular planar shape having a short side in an x direction and a long side in a y direction. An edge where the short side in the x direction and the long side in the y direction meet each other may be round or curved to have a certain curvature or formed to have a right angle. A planar shape of the display device 1 is not limited to a rectangular shape, and may be any of other shapes such as a polygonal shape, an elliptical shape, or an irregular shape.

The display device 1 may include a display area DA where images are displayed by using light emitted by sub-pixels and a peripheral area PA outside the display area DA. The display device 1 may be of a portable bar type as shown in FIG. 1A, or may be of a portable foldable type as shown in FIG. 1B. For example, the display device 1 may be foldable about an axis AX crossing the display area DA as shown in FIG. 1B.

Figure 2:
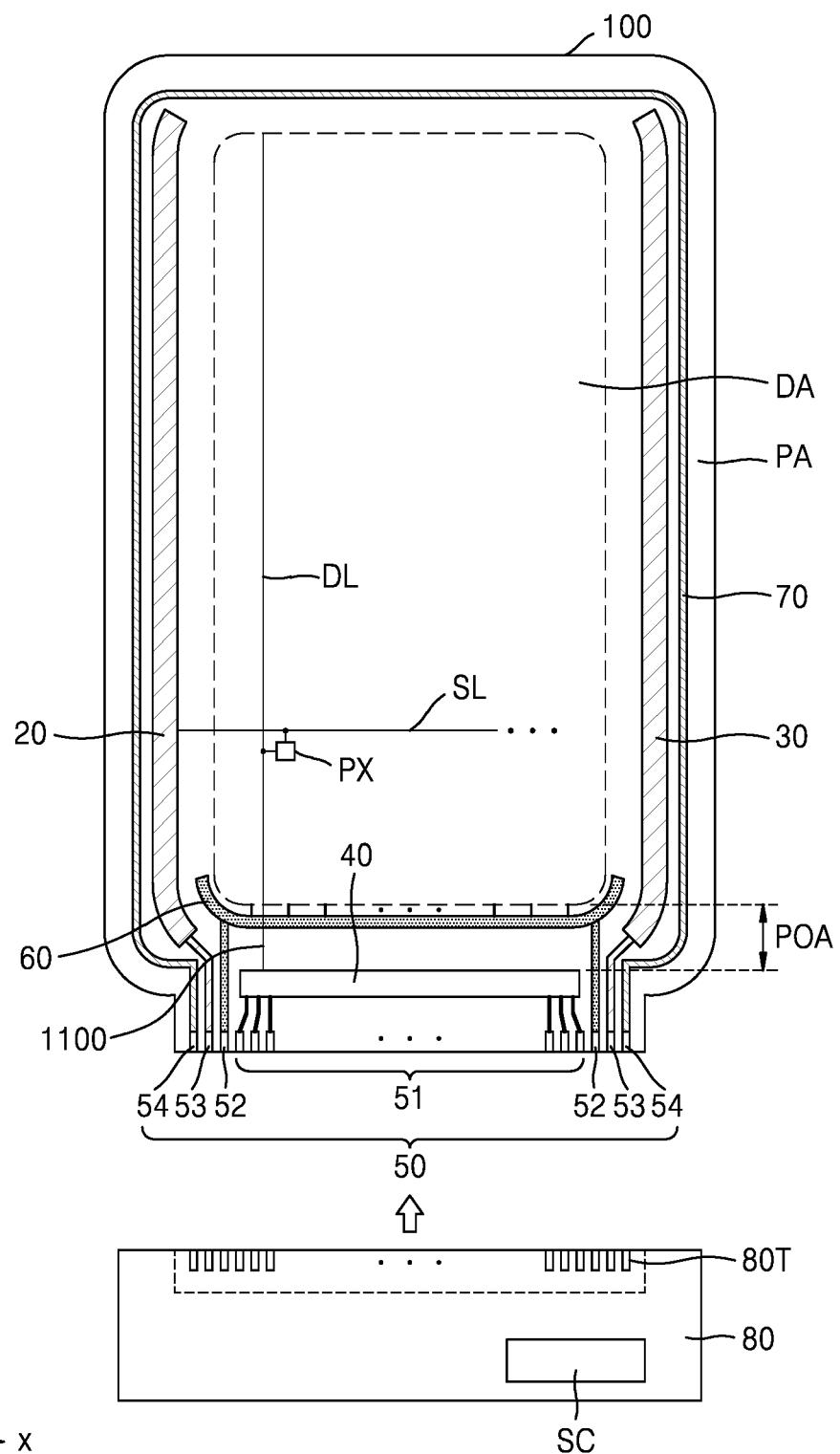
FIG. 2 is a plan view illustrating a display panel according to some embodiments.

FIG. 2 is a plan view illustrating a display panel according to some embodiments.

Referring to FIG. 2, in the display device 1, sub-pixels PX located in the display area DA may emit red, green, and blue light by using light-emitting diodes located at positions corresponding to the sub-pixels PX. Signal lines such as a data line DL and a scan line SL electrically connected to a storage capacitor and transistors electrically connected to the light-emitting diode may be located in the display area DA. The data lines DL may extend in the y direction in the display area DA, and the scan lines SL may extend in the x direction in the display area DA.

The peripheral area PA may be located outside the display area DA, and may entirely surround the display area DA.

First and second scan drivers 20 and 30 may be located in the peripheral area PA, and may be electrically connected to the scan lines SL. According to some embodiments, some of the scan lines SL may be electrically connected to the first scan driver 20, and the remaining scan lines SL may be connected to the second scan driver 30. Each of the first and second scan drivers 20 and 30 may generate a scan signal, and the generated scan signal may be transmitted to the transistor electrically connected to the light-emitting diode through the scan line SL.

The first and second scan drivers 20 and 30 may be located on both sides of the display area DA. For example, as shown in FIG. 2, the first scan driver 20 may be located on the left of the display area DA, and the second scan driver 30 may be located on the right of the display area DA. According to some embodiments, one of the first and second scan drivers 20 and 30 may be omitted.

A driving voltage supply line 60 is located in the peripheral area PA. The driving voltage supply line 60 may be located between the display area DA and a side of a substrate 100 on which a terminal unit 50 is located.

A common voltage supply line 70 may be located in the peripheral area PA, and may have a loop shape of which one side extending along the display area DA is open. The common voltage supply line 70 may have a substantially U-shape as shown in FIG. 2. The common voltage supply line 70 may extend along sides other than the side of the substrate 100 on which the terminal unit 50 is located, and thus, the first scan driver 20 may be located between a portion of the common voltage supply line 70 and the display area DA and the second scan driver 30 may be located between another portion of the common voltage supply line 70 and the display area DA.

An integrated circuit 40 may be located in the peripheral area PA. The integrated circuit 40 may be located between the display area DA and the side of the substrate 100 on which the terminal unit 50 is located. The integrated circuit 40 may include a data driver. The integrated circuit 40 used herein may represent the data driver. The integrated circuit 40 may be electrically connected to a pad electrode located under the integrated circuit 40. A data signal generated by the integrated circuit 40, for example, the data driver, may be transmitted to a signal line, for example, the data line DL, located in the display area DA through a connection line 1100 located in a fan-out area POA. The fan-out area POA that is a portion of the peripheral area PA is between the integrated circuit 40 and the display area DA.

The terminal unit 50 may include terminals 51, 52, 53, and 54. The terminals 51, 52, 53, and 54 may be exposed without being covered by an insulating layer, and may be electrically connected to a controller SC located on a flexible printed circuit board 80. The flexible printed circuit board 80 may include counter terminals 80T corresponding to the terminal unit 50. The counter terminals 80T of the flexible printed circuit board 80 may be electrically connected to the terminals 51, 52, 53, and 54. The controller SC may generate control signals for controlling the first and second scan drivers 20 and 30 and the integrated circuit 40, and the generated control signals may be transmitted to the first and second scan drivers 20 and 30 and the integrated circuit 40 through the terminals 51 and 53. The controller SC may respectively transmit a driving voltage and a common voltage to the driving voltage supply line 60 and the common voltage supply line 70 through the terminals 52 and 54.

Figure 3:
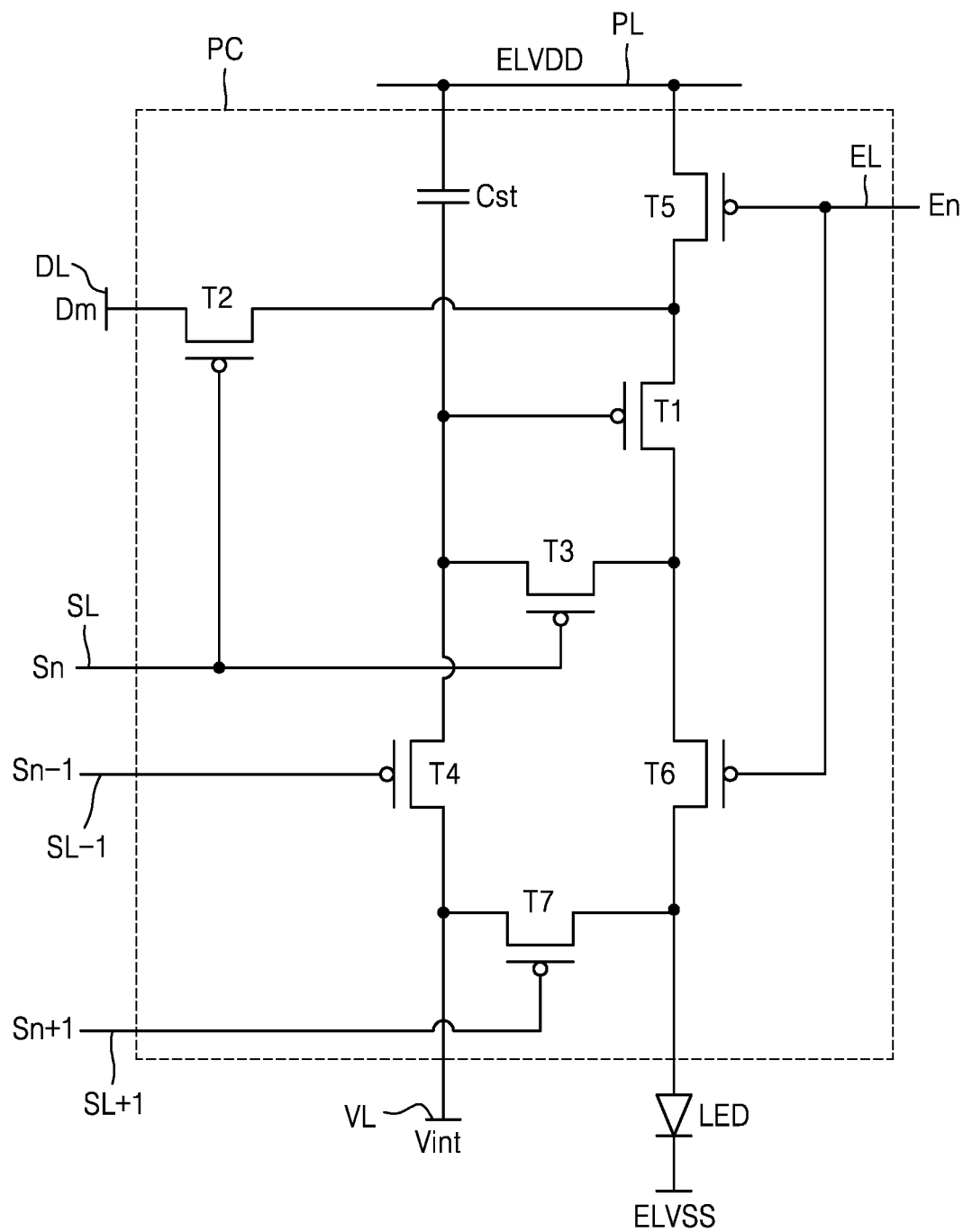
FIG. 3 is an equivalent circuit diagram illustrating a sub-pixel circuit electrically connected to a light-emitting diode provided in a display device according to some embodiments.

FIG. 3 is an equivalent circuit diagram illustrating a sub-pixel circuit electrically connected to a light-emitting diode provided in a display device according to some embodiments.

As described with reference to FIG. 2, each sub-pixel PX (see FIG. 2) may emit light by using a light-emitting diode. The light-emitting diode may be electrically connected to a sub-pixel circuit PC.

The sub-pixel circuit PC may include a first thin-film transistor T1, a second thin-film transistor T2, a third thin-film transistor T3, a fourth thin-film transistor T4, a fifth thin-film transistor T5, a sixth thin-film transistor T6, a seventh thin-film transistor T7, and a storage capacitor Cst.

The second thin-film transistor T2 that is a switching thin-film transistor may be connected to the scan line SL and the data line DL, and may transmit a data voltage (or a data signal Dm) input from the data line DL to the first thin-film transistor T1 based on a switching voltage (or a switching signal Sn) input from the scan line SL. The storage capacitor Cst may be connected to the second thin-film transistor T2 and a driving voltage line PL, and may store a voltage corresponding to a difference between a voltage received from the second thin-film transistor T2 and a driving voltage ELVDD supplied to the driving voltage line PL.

The first thin-film transistor T1 that is a driving thin-film transistor may be connected to the driving voltage line PL and the storage capacitor Cst, and may control driving current flowing from the driving voltage line PL to a light-emitting diode LED in response to a value of the voltage stored in the storage capacitor Cst. The light-emitting diode LED may emit light having a certain luminance due to the driving current. A second electrode (e.g., a cathode) of the light-emitting diode LED may receive a common voltage ELVSS.

A gate electrode of the third thin-film transistor T3 that is a compensation thin-film transistor may be connected to the scan line SL. A source electrode (or a drain electrode) of the third thin-film transistor T3 may be connected to a drain electrode (or a source electrode) of the first thin-film transistor T1, and may be connected to a first electrode of the light-emitting diode LED via the sixth thin-film transistor T6. The drain electrode (or the source electrode) of the third thin-film transistor T3 may be connected to one electrode of the storage capacitor Cst, a source electrode (or a drain electrode) of the fourth thin-film transistor T4, and a gate electrode of the first thin-film transistor T1. The third thin-film transistor T3 may be turned on according to a scan signal Sn received through the scan line SL, and may diode-connect the first thin-film transistor T1 by connecting the gate electrode to the drain electrode of the first thin-film transistor T1.

A gate electrode of the fourth thin-film transistor T4 that is an initialization thin-film transistor may be connected to a previous scan line SL−1. The drain electrode (or the source electrode) of the fourth thin-film transistor T4 may be connected to an initialization voltage line VL. The source electrode (or the drain electrode) of the fourth thin-film transistor T4 may be connected to one electrode of the storage capacitor Cst, the drain electrode (or the source electrode) of the third thin-film transistor T3, and the gate electrode of the first thin-film transistor T1. The fourth thin-film transistor T4 may be turned on according to a previous scan signal Sn−1 received through the previous scan line SL−1, and may perform an initialization operation of initializing a voltage of the gate electrode of the first thin-film transistor T1 by supplying an initialization voltage Vint to the gate electrode of the first thin-film transistor T1.

A gate electrode of the fifth thin-film transistor T5 that is an operation control thin-film transistor may be connected to an emission control line EL. A source electrode (or a drain electrode) of the fifth thin-film transistor T5 may be connected to the driving voltage line PL. The drain electrode (or the source electrode) of the fifth thin-film transistor T5 is connected to the source electrode (or the drain electrode) of the first thin-film transistor T1 and a drain electrode (or a source electrode) of the second thin-film transistor T2.

A gate electrode of the sixth thin-film transistor T6 that is an emission control thin-film transistor may be connected to the emission control line EL. A source electrode (or a drain electrode) of the sixth thin-film transistor T6 may be connected to the drain electrode (or the source electrode) of the first thin-film transistor T1 and the source electrode (or the drain electrode) of the third thin-film transistor T3. The drain electrode (or the source electrode) of the sixth thin-film transistor T6 may be electrically connected to the first electrode of the light-emitting diode LED. The fifth thin-film transistor T5 and the sixth thin-film transistor T6 may be simultaneously turned on according to an emission control signal En received through the emission control line EL, and thus, the driving voltage ELVDD is supplied to the light-emitting diode LED and driving current flows through the light-emitting diode LED.

The seventh thin-film transistor T7 may be an initialization thin-film transistor for initializing the first electrode of the light-emitting diode LED. A gate electrode of the seventh thin-film transistor T7 may be connected to a next scan line SL+1. A source electrode (or a drain electrode) of the seventh thin-film transistor T7 may be connected to the first electrode of the light-emitting diode LED. The drain electrode (or the source electrode) of the seventh thin-film transistor T7 may be connected to the initialization voltage line VL. The seventh thin-film transistor T7 may be turned on according to a next scan signal Sn+1 received through the next scan line SL+1, and may initialize the first electrode of the light-emitting diode LED.

Although the fourth thin-film transistor T4 and the seventh thin-film transistor T7 are respectively connected to the previous scan line SL−1 and the next scan line SL+1 in FIG. 3, according to some embodiments, both the fourth thin-film transistor T4 and the seventh thin-film transistor T7 may be connected to the previous scan line SL−1 and may be driven according to the previous scan signal Sn−1.

The other electrode of the storage capacitor Cst may be connected to the driving voltage line PL. One electrode of the storage capacitor Cst may be connected to the gate electrode of the first thin-film transistor T1, the drain electrode (or the source electrode) of the third thin-film transistor T3, and the source electrode (or the drain electrode) of the fourth thin-film transistor T4.

The second electrode (e.g., cathode) of the light-emitting diode LED receives the common voltage ELVSS. The light-emitting diode LED receives driving current from the first thin-film transistor T1 and emits light.

The light-emitting diode LED may be an organic light-emitting diode including an organic material as a light-emitting material. According to some embodiments, the light-emitting diode may be an inorganic light-emitting diode including an inorganic material. The inorganic light-emitting diode may include a PN diode including inorganic semiconductor-based materials. When a voltage is applied to a PN junction diode in a forward direction, holes and electrons may be injected, and energy generated by recombination of the holes and electrons may be converted into light energy to emit light of a certain color. The inorganic light-emitting diode may have a width of several to hundreds of micrometers, or several to hundreds of nanometers. In some embodiments, the light-emitting diode LED may include a quantum-dot light-emitting diode. As described above, an emission layer of the light-emitting diode LED may include an organic material, may include an inorganic material, may include quantum dots, may include an organic material and quantum dots, or may include an inorganic material and quantum dots. For convenience of description, the following will be described assuming that the light-emitting diode LED includes an organic light-emitting diode.

Figure 4:
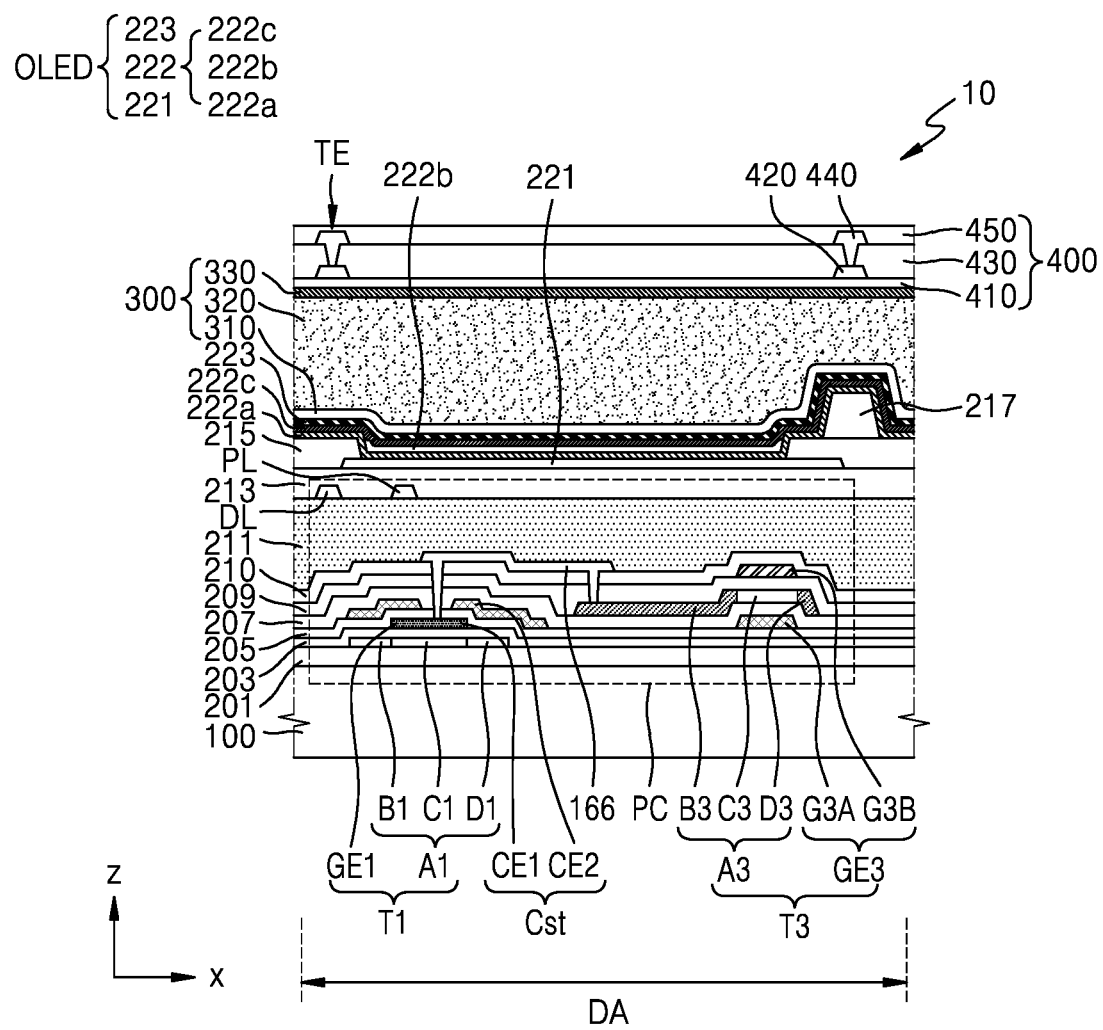
FIG. 4 is a cross-sectional view illustrating a part of a display device according to some embodiments.

FIG. 4 is a cross-sectional view illustrating a part of a display device according to some embodiments.

FIG. 4 illustrates a sub-pixel circuit PC and a light-emitting diode, for example, an organic light-emitting diode OLED, located in the display area DA of the display device.

The substrate 100 may include a glass material or a polymer resin. According to some embodiments, the substrate 100 may have a structure in which a base layer including a polymer resin and a barrier layer including an inorganic insulating material such as silicon oxide or silicon nitride are alternately stacked. When the substrate 100 has a structure in which a base layer including a polymer resin and a barrier layer including an inorganic insulating material are stacked as described above, the flexibility of the display device 1 may be improved as described with reference to FIG. 1B, and thus the display device 1 may be foldable.

Examples of the polymer resin may include polyethersulfone, polyarylate, polyether imide, polyethylene naphthalate, polyethylene terephthalate, polyphenylene sulfide, polyimide, polycarbonate, cellulose triacetate, and cellulose acetate propionate.

The sub-pixel circuit PC may be formed on the substrate 100, and a light-emitting diode, for example, an organic light-emitting diode OLED, may be formed on the sub-pixel circuit PC.

Before the sub-pixel circuit PC is formed on the substrate 100, a buffer layer 201 may be formed on the substrate 100 to prevent or reduce instances of impurities penetrating into the sub-pixel circuit PC. The buffer layer 201 may include an inorganic insulating material such as silicon nitride, silicon oxynitride, or silicon oxide, and may have a single or multi-layer structure including the above inorganic insulating material.

The sub-pixel circuit PC may include a plurality of transistors and a storage capacitor as described with reference to FIG. 3. In this regard, FIG. 4 illustrates the first thin-film transistor T1, the third thin-film transistor T3, and the storage capacitor Cst.

The first thin-film transistor T1 may include a semiconductor layer (hereinafter, referred to as a first semiconductor layer A1) on the buffer layer 201 and a gate electrode (hereinafter, referred to as a first gate electrode GE1) overlapping a channel region Cl of the first semiconductor layer A1. The first semiconductor layer A1 may include a silicon-based semiconductor material, for example, polysilicon. The first semiconductor layer A1 may include the channel region Cl and a first region B1 and a second region D1 located on both sides of the channel region Cl. The first region B1 and the second region D1 are regions having a higher impurity concentration than the channel region Cl, and one of the first region B1 and the second region D1 may correspond to a source region and the other may correspond to a drain region.

A first gate insulating layer 203 may be located between the first semiconductor layer A1 and the first gate electrode GE1. The first gate insulating layer 203 may include an inorganic insulating material such as silicon oxide, silicon nitride, or silicon oxynitride, and may have a single or multi-layer structure including the above inorganic insulating material.

The first gate electrode GE1 may include a conductive material including molybdenum (Mo), aluminum (Al), copper (Cu), or titanium (T1), and may have a single or multi-layer structure including the above material.

The storage capacitor Cst may include a lower electrode CE1 and an upper electrode CE2 overlapping each other. According to some embodiments, the lower electrode CE1 of the storage capacitor Cst may include the first gate electrode GE1. In other words, the first gate electrode GE1 may include the lower electrode CE1 of the storage capacitor Cst. For example, the first gate electrode GE1 and the lower electrode CE1 of the storage capacitor Cst may be integrally formed with each other.

A first interlayer insulating layer 205 may be located between the lower electrode CE1 and the upper electrode CE2 of the storage capacitor Cst. The first interlayer insulating layer 205 may include an inorganic insulating material such as silicon oxide, silicon nitride, or silicon oxynitride, and may have a single or multi-layer structure including the above inorganic insulating material.

The upper electrode CE2 of the storage capacitor Cst may include a low-resistance conductive material such as molybdenum (Mo), aluminum (Al), copper (Cu), and/or titanium (T1), and may have a single or multi-layer structure including the above material.

A second interlayer insulating layer 207 may be located on the storage capacitor Cst. The second interlayer insulating layer 207 may include an inorganic insulating material such as silicon oxide, silicon nitride, or silicon oxynitride, and may have a single or multi-layer structure including the above inorganic insulating material.

A semiconductor layer (hereinafter, referred to as a third semiconductor layer A3) of the third thin-film transistor T3 may be located on the second interlayer insulating layer 207. The third semiconductor layer A3 may include an oxide-based semiconductor material. For example, the third semiconductor layer A3 may be formed of a Zn oxide-based material, for example, Zn oxide, In—Zn oxide, or Ga—In—Zn oxide. In some embodiments, the third semiconductor layer A3 may be formed of an In—Ga—Zn—O (IGZO), In—Sn—Zn—O (ITZO), or In—Ga—Sn—Zn—O (IG-TZO) semiconductor containing a metal such as indium (In), gallium (Ga), or tin (Sn) in ZnO.

The third semiconductor layer A3 may include a channel region C3 and a first region B3 and a second region D3 located on both sides of the channel region C3. One of the first region B3 and the second region D3 may correspond to a source region and the other may correspond to a drain region.

The third thin-film transistor T3 may include a gate electrode (hereinafter, referred to as a third gate electrode GE3) overlapping the channel region C3 of the third semiconductor layer A3. The third gate electrode GE3 may have a dual-gate structure including a lower gate electrode G3A located under the third semiconductor layer A3 and an upper gate electrode G3B located over the channel region C3.

The lower gate electrode G3A may be located on the same layer (e.g., the first interlayer insulating layer 205) as the upper electrode CE2 of the storage capacitor Cst. The lower gate electrode G3A may include the same material as that of the upper electrode CE2 of the storage capacitor Cst.

The upper gate electrode G3B may be located over the third semiconductor layer A3 with a second gate insulating layer 209 therebetween. The second gate insulating layer 209 may include an inorganic insulating material such as silicon oxide, silicon nitride, or silicon oxynitride, and may have a single or multi-layer structure including the above inorganic insulating material.

A third interlayer insulating layer 210 may be located on the upper gate electrode G3B. The third interlayer insulating layer 210 may include an inorganic insulating material such as silicon oxynitride, and may have a single or multi-layer structure including the above inorganic insulating material.

Although the first thin-film transistor T1 and the third thin-film transistor T3 from among a plurality of thin-film transistors described with reference to FIG. 3 are illustrated and the first semiconductor layer A1 and the third semiconductor layer A3 are located on different layers in FIG. 4, the disclosure is not limited thereto.

The second, fifth, sixth, and seventh thin-film transistors T2, T5, T6, and T7 (see FIG. 3) described with reference to FIG. 3 may each have the same structure as that of the first thin-film transistor T1 described with reference to FIG. 4. For example, each of the second, fifth, sixth, and seventh thin-film transistors T2, T5, T6, and T7 (see FIG. 3) may include a semiconductor layer located on the same layer as the first semiconductor layer A1 of the first thin-film transistor T1, and a gate electrode located on the same layer as the first gate electrode GE1 of the first thin-film transistor T1. The semiconductor layers of the second, fifth, sixth, and seventh thin-film transistors T2, T5, T6, and T7 (see FIG. 3) may be integrally connected to the first semiconductor layer A1.

The fourth thin-film transistor T4 (see FIG. 3) described with reference to FIG. 3 may have the same structure as that of the third thin-film transistor T3 described with reference to FIG. 4. For example, the fourth thin-film transistor T4 may include a semiconductor layer located on the same layer as the third semiconductor layer A3 of the third thin-film transistor T3, and a gate electrode formed on the same layer as the third gate electrode GE3 of the third thin-film transistor T3. The semiconductor layer of the fourth thin-film transistor T4 and the third semiconductor layer A3 of the third thin-film transistor T3 may be integrally connected to each other.

The first thin-film transistor T1 and the third thin-film transistor T3 may be electrically connected to each other through a node connection line 166. The node connection line 166 may be located on the third interlayer insulating layer 210. One side of the node connection line 166 may be connected to the first gate electrode GE1 of the first thin-film transistor T1, and the other side of the node connection line 166 may be connected to the third semiconductor layer A3 of the third thin-film transistor T3.

The node connection line 166 may include aluminum (Al), copper (Cu), and/or titanium (T1), and may have a single or multi-layer structure including the above material. For example, the node connection line 166 may have a three-layer structure including a titanium layer, an aluminum layer, and a titanium layer.

A first organic insulating layer 211 may be located on the node connection line 166. The first organic insulating layer 211 may include an organic insulating layer. The organic insulating material may include acryl, benzocyclobutene (BCB), polyimide, or hexamethyldisiloxane (HMDSO).

The data line DL and the driving voltage line PL may be located on the first organic insulating layer 211, and may be covered by a second organic insulating layer 213. Each of the data line DL and the driving voltage line PL may include aluminum (Al), copper (Cu), and/or titanium (T1), and may have a single or multi-layer structure including the above material. For example, each of the data line DL and the driving voltage line PL may have a three-layer structure including a titanium layer, an aluminum layer, and a titanium layer.

The second organic insulating layer 213 may include an organic insulating material such as acryl, BCB, polyimide, and/or HMDSO. Although the data line DL and the driving voltage line PL are formed on the first organic insulating layer 211 in FIG. 4, the disclosure is not limited thereto. According to some embodiments, one of the data line DL and the driving voltage line PL may be located on the same layer, for example, the third interlayer insulating layer 210, as the node connection line 166.

The light-emitting diode, for example, the organic light-emitting diode OLED, may be located on the second organic insulating layer 213.

A first electrode 221 of the organic light-emitting diode OLED may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the first electrode 221 may further include a conductive oxide layer over and/or under the reflective film. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). According to some embodiments, the first electrode 221 may have a three-layer structure including an ITO layer, an Ag layer, and an ITO layer.

A bank layer 215 may be located on the first electrode 221. The bank layer 215 may have an opening overlapping the first electrode 221, and may cover an edge of the first electrode 221. The bank layer 215 may include an organic insulating material such as polyimide.

An intermediate layer 222 includes an emission layer 222b. The intermediate layer 222 may include a first functional layer 222a located under the emission layer 222b and/or a second functional layer 222c located over the emission layer 222b. The emission layer 222b may include a high molecular weight organic material or a low molecular weight organic material emitting light of a certain color. The second functional layer 222c may include an electron transport layer (ETL) and/or an electron injection layer (EIL). Each of the first functional layer 222a and the second functional layer 222c may include an organic material.

A second electrode 223 may be formed of a conductive material having a low work function. For example, the second electrode 223 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the second electrode 223 may further include a layer formed of ITO, IZO, ZnO, or $In_2O_3$ on the (semi-)transparent layer including the above material.

The emission layer 222b may be formed in the display area DA to overlap the first electrode 221 through an opening of the bank layer 215. In contrast, the first functional layer 222a, the second functional layer 222c, and the second electrode 223 may entirely cover the display area DA.

A spacer 217 may be formed on the bank layer 215. The spacer 217 and the bank layer 215 may be formed together in the same process, or may be individually formed in separate processes. According to some embodiments, the spacer 217 may include an organic insulating material such as polyimide. Alternatively, the bank layer 215 may include an organic insulating material including a light-shielding dye, and the spacer 217 may include an organic insulating material such as polyimide.

The organic light-emitting diode OLED may be covered by an encapsulation layer 300. The encapsulation layer 300 may include at least one organic encapsulation layer and at least one inorganic encapsulation layer. According to some embodiments, in FIG. 4, the encapsulation layer 300 includes first and second inorganic encapsulation layers 310 and 330 and an organic encapsulation layer 320 located between the first and second inorganic encapsulation layers 310 and 330.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. Each of the first inorganic encapsulation layer 310 and the second inorganic encapsulation layer 330 may have a single or multi-layer structure including the above material. The organic encapsulation layer 320 may include a polymer-based material. Examples of the polymer-based material may include an acrylic resin, an epoxy resin, polyimide, and polyethylene. According to some embodiments, the organic encapsulation layer 320 may include acrylate.

Thicknesses of the first inorganic encapsulation layer 310 and the second inorganic encapsulation layer 330 may be different from each other. A thickness of the first inorganic encapsulation layer 310 may be greater than a thickness of the second inorganic encapsulation layer 330. Alternatively, a thickness of the second inorganic encapsulation layer 330 may be greater than a thickness of the first inorganic encapsulation layer 310, or thicknesses of the first inorganic encapsulation layer 310 and the second inorganic encapsulation layer 330 may be the same.

An input sensing layer 400 may be located on the encapsulation layer 300. The input sensing layer 400 may include touch electrodes TE located in the display area DA, and at least one touch insulating layer. In this regard, in FIG. 4, the input sensing layer 400 includes a first touch insulating layer 410 on the second inorganic encapsulation layer 330, a first conductive line 420 on the first touch insulating layer 410, a second touch insulating layer 430 on the first conductive line 420, a second conductive line 440 on the second touch insulating layer 430, and a third touch insulating layer 450 on the second conductive line 440.

Each of the first touch insulating layer 410, the second touch insulating layer 430, and the third touch insulating layer 450 may include an inorganic insulating material and/or an organic insulating material. According to some embodiments, each of the first touch insulating layer 410 and the second touch insulating layer 430 may include an inorganic insulating material such as silicon oxide, silicon nitride, and/or silicon oxynitride, and the third touch insulating layer 450 may include an organic insulating material.

Each of the touch electrodes TE of the input sensing layer 400 may have a structure in which the first conductive line 420 and the second conductive line 440 are connected to each other. Alternatively, the touch electrode TE may include one of the first conductive line 420 and the second conductive line 440, and in this case, the second touch insulating layer 430 may be omitted.

Each of the first conductive line 420 and the second conductive line 440 may include aluminum (Al), copper (Cu), and/or titanium (T1), and may have a single or multi-layer structure including the above material. For example, each of the first conductive line 420 and the second conductive line 440 may have a three-layer structure including a titanium layer, an aluminum layer, and a titanium layer.

Figure 5A:
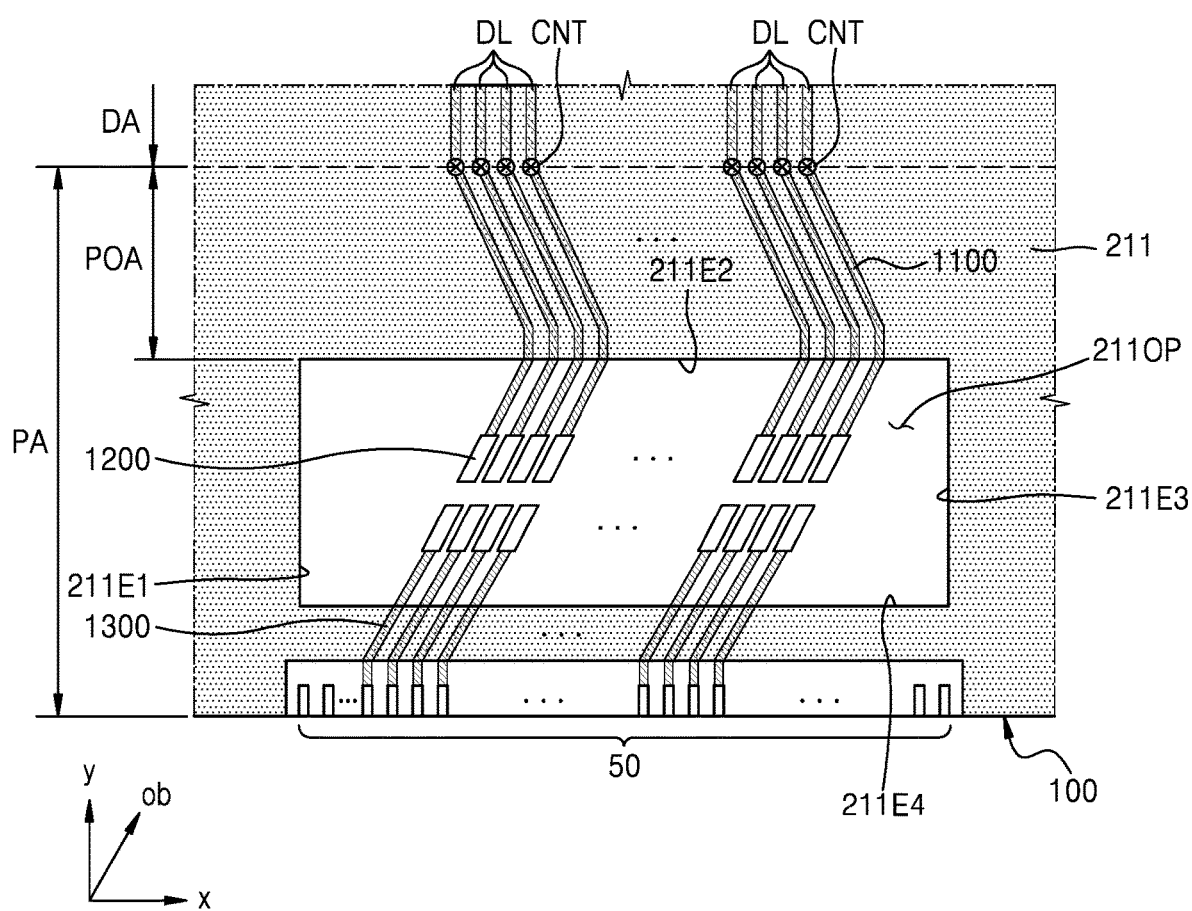
FIG. 5A is a plan view illustrating an arrangement of pad electrodes and a first organic insulating layer located in a peripheral area of a display device according to some embodiments.
Figure 5B:
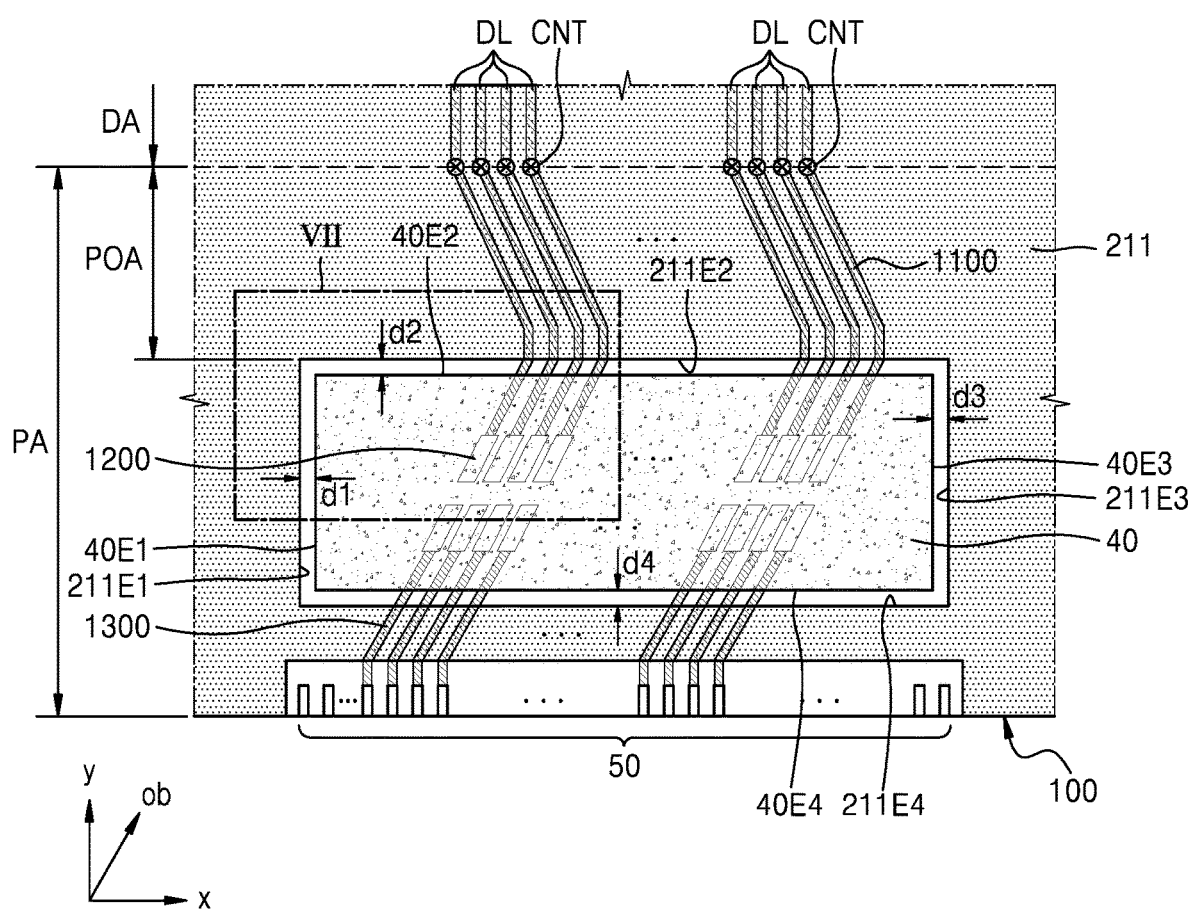
FIG. 5B is a plan view illustrating an integrated circuit located on the pad electrodes of FIG. 5A according to some embodiments.
Figure 6:
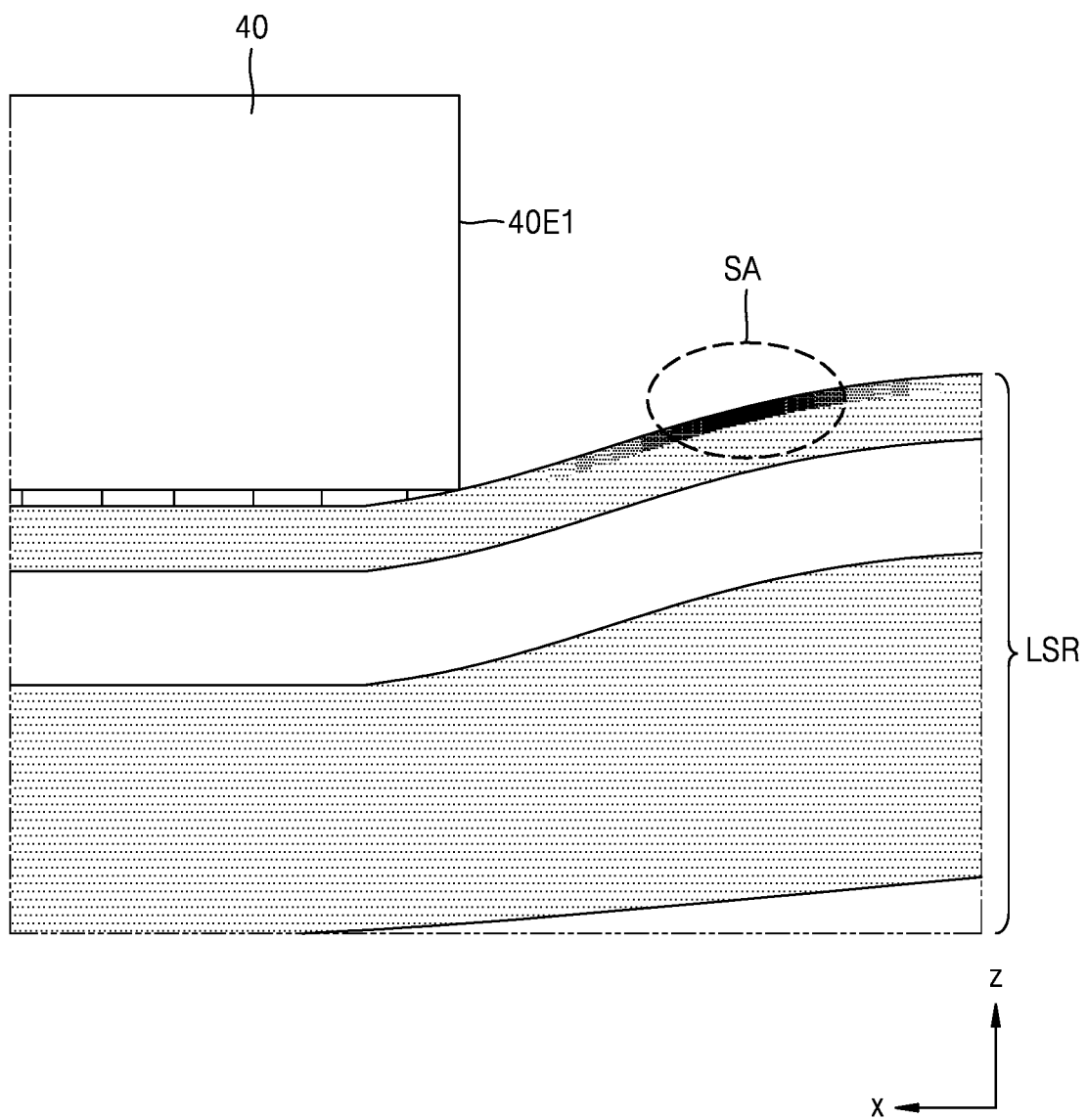
FIG. 6 is an image illustrating stress caused in a display device during bonding of an integrated circuit according to some embodiments.

FIG. 5A is a plan view illustrating an arrangement of pad electrodes and a first organic insulating layer located in a peripheral area of a display device according to some embodiments. FIG. 5B is a plan view illustrating an integrated circuit located on the pad electrodes of FIG. 5A. FIG. 6 is an image illustrating stress caused in a display device during bonding of an integrated circuit.

Referring to FIG. 5A, pad electrodes 1200 are located between a side of the substrate 100 on which the terminal unit 50 is located and the display area DA. The pad electrodes 1200 may be arranged in rows in the x direction. According to some embodiments, although the pad electrodes 1200 are arranged in two rows in FIG. 5A, the disclosure is not limited thereto. According to some embodiments, the pad electrodes 1200 may be arranged in three or more rows.

Each of the pad electrodes 1200 may extend in an oblique direction ob to have an acute angle in the x direction and the y direction. In some embodiments, the pad electrode 1200 may have a substantially parallelogram planar shape. Some of the pad electrodes 1200 may be electrically connected to a signal line, for example, the data line DL, located in the display area DA through the connection line 1100. The connection line 1100 and the data line DL may be connected to each other through a contact hole CNT formed in at least one insulating layer located between the connection line 1100 and the data line DL. Others of the pad electrodes 1200 may be electrically connected to terminals of the terminal unit 50 through an outer connection line 1300.

The first organic insulating layer 211 described with reference to FIG. 4 may be located not only in the display area DA but also in the peripheral area PA. The first organic insulating layer 211 may have an opening 211OP through which the pad electrodes 1200 are exposed to electrically connect the pad electrodes 1200 to the integrated circuit 40. The opening 2110P overlaps the pad electrodes 1200.

The opening 2110P may have a shape corresponding to that of the integrated circuit 40 described below with reference to FIG. 5B. For example, the integrated circuit 40 may have a substantially quadrangular planar shape, and the opening 211OP may also have a substantially quadrangular planar shape. First through fourth edges 211E1, 211E2, 211E3, and 211E4 of the first organic insulating layer 211 defining the opening 211OP may be respectively located adjacent to first through fourth edges 40E1, 40E2, 40E3, and 40E4 of the integrated circuit 40.

Referring to FIG. 5B, the integrated circuit 40 may overlap the pad electrodes 1200. The integrated circuit 40 may be electrically connected to the pad electrodes 1200 by a conductive adhesive layer such as an anisotropic conductive film.

In a plan view, the integrated circuit 40 may be located within the opening 211OP of the first organic insulating layer 211. In a plan view, the first through fourth edges 211E1, 211E2, 211E3, and 211E4 of the first organic insulating layer 211 defining the opening 211OP may be respectively located outside the first through fourth edges 40E1, 40E2, 40E3, and 40E4 of the integrated circuit 40.

The first through fourth edges 211E1, 211E2, 211E3, and 211E4 of the first organic insulating layer 211 are respectively spaced apart from the first through fourth edges 40E1, 40E2, 40E3, and 40E4 of the integrated circuit 40. Each of first through fourth distances d1, d2, d3, and d4 between the first through fourth edges 40E1, 40E2, 40E3, and 40E4 of the integrated circuit 40 and the first through fourth edges 211E1, 211E2, 211E3, and 211E4 of the first organic insulating layer 211 may be about 40 μm or more.

During bonding of the integrated circuit 40, stress may concentrate on and around the first through fourth edges 211E1, 211E2, 211E3, and 211E4 of the first organic insulating layer 211. FIG. 6 illustrates stress generated away from the first edge 40E1 of the integrated circuit 40, indicating that the darker the color, the greater the stress. In FIG. 6, stress concentrates on an "SA" area, and the "SA" area corresponds to a portion of a structure LSR located under the integrated circuit 40. The structure LSR under the integrated circuit 40 may include the substrate 100 (see FIG. 5A) and elements and layers between the substrate 100 and the integrated circuit 40. As described in FIGS. 5A and 5B, insulating layers, the connection line 1100, and the pad electrodes 1200 may be provided between the substrate 100 and the integrated circuit 40.

Because a distance between the first through fourth edges 211E1, 211E2, 211E3, and 211E4 of the first organic insulating layer 211 and the first through fourth edges 40E1, 40E2, 40E3, and 40E4 of the integrated circuit 40 is about 40 µm or more, the first through fourth edges 211E1, 211E2, 211E3, and 211E4 of the first organic insulating layer 211 may not be located in the "SA" area and thus stress caused on and around the edges of the first organic insulating layer 211 may be effectively distributed. When each of the first through fourth distances d1, d2, d3, and d4 is less than 40 µm, in other words, when the first through fourth edges 211E1, 211E2, 211E3, and 211E4 of the first organic insulating layer 211 and the first through fourth edges 40E1, 40E2, 40E3, and 40E4 of the integrated circuit 40 are spaced apart from each other to have a distance less than 40 µm, stress may concentrate on the first through fourth edges 211E1, 211E2, 211E3, and 211E4 of the first organic insulating layer 211. In this case, cracks may occur around the integrated circuit 40, and when the cracks may propagate to a bonding portion of the integrated circuit 40, the bonding quality of the integrated circuit 40 may be degraded or a driving malfunction of the integrated circuit 40, for example, a data driver, may be caused.

In some embodiments, each of the first through fourth distances d1, d2, d3, and d4 may range from about 40 µm to about 80 µm. For example, it may be appropriate that each of the second distance d2 and the fourth distance d4 ranges from about 40 µm to about 80 µm. It may be appropriate that, considering stress, each of the second distance d2 and the fourth distance d4 is about 40 µm or more, and considering an overlapping structure between the first organic insulating layer 211 and the connection line 1100 located in the fan-out area POA or an outer connection line 1300, each of the second distance d2 and the fourth distance d4 does not exceed about 80 µm.

When each of the second and fourth distances d2 and d4 is greater than about 80 µm, in other words, when the second and fourth edges 211E2 and 211E4 of the first organic insulating layer 211 are spaced apart from the second and fourth edges 40E2 and 40E4 of the integrated circuit 40 to have a distance greater than 80 µm, the area of a portion of each of the connection line 1100 and the outer connection line 1300 not overlapping the first organic insulating layer 211 may increase, and in this case, the quality of the connection line 1100 and the outer connection line 1300 and surroundings thereof may be degraded. Like the second and fourth distances d2 and d4, each of the first and third distances d1 and d3 may be about 80 µm or less.

The first through fourth distances d1, 2, d3, and d4 may be selected in the above range, and may have the same value. For example, the first through fourth edges 211E1, 211E2, 211E3, and 211E4 and the first organic insulating layer 211 and the first through fourth edges 40E1, 40E2, 40E3, and 40E4 of the integrated circuit 40 may be spaced apart to have the same distance (e.g., d1=d2=d3=d4). According to some embodiments, two or more selected from among the first through fourth distances d1, 2, d3, and d4 may be different. For example, at least one of the first through fourth distances d1, 2, d3, or d4 may be different from the others.

Figure 7:
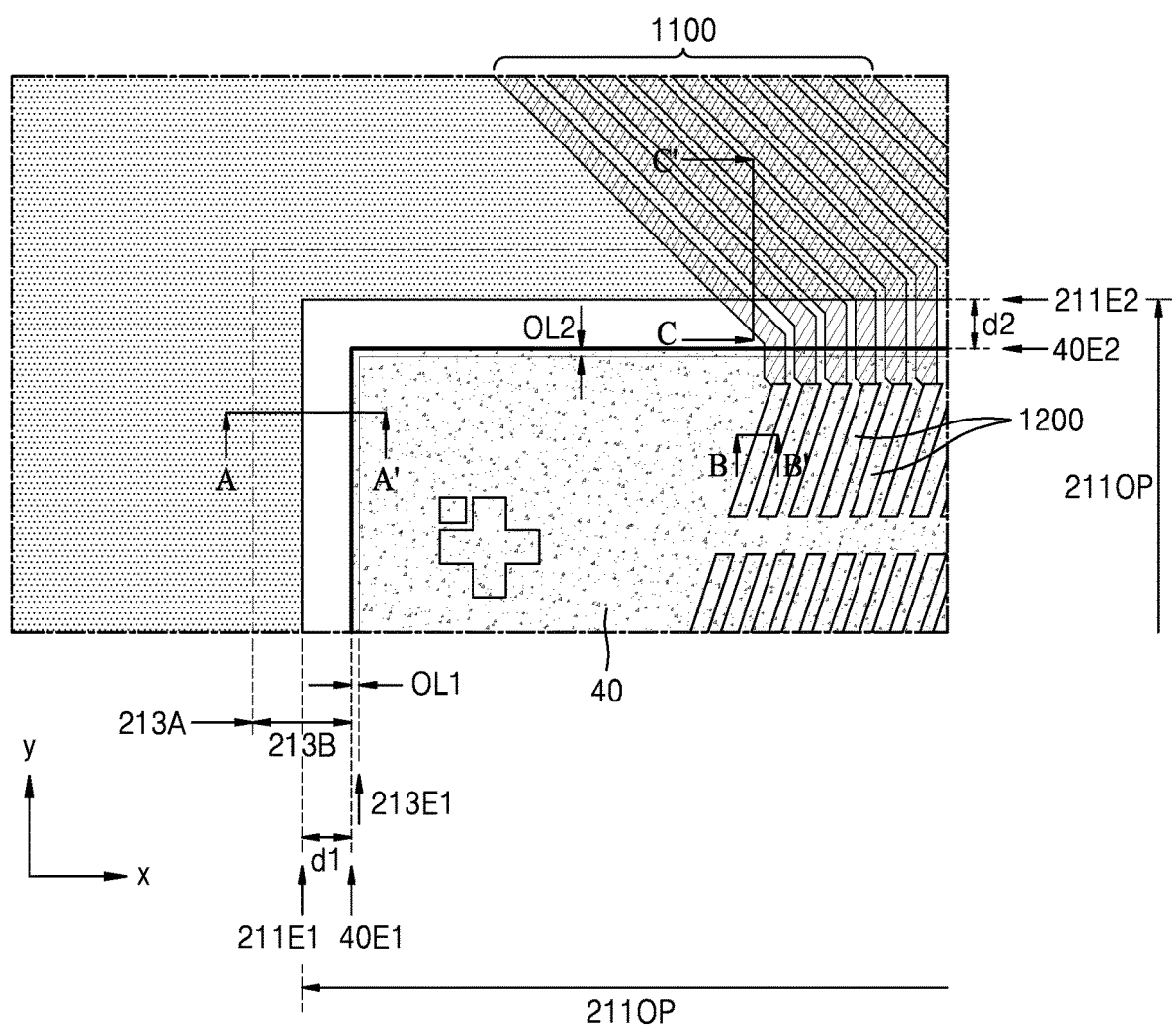
FIG. 7 is an enlarged plan view illustrating a portion VII of FIG. 5B according to some embodiments.
Figure 8:
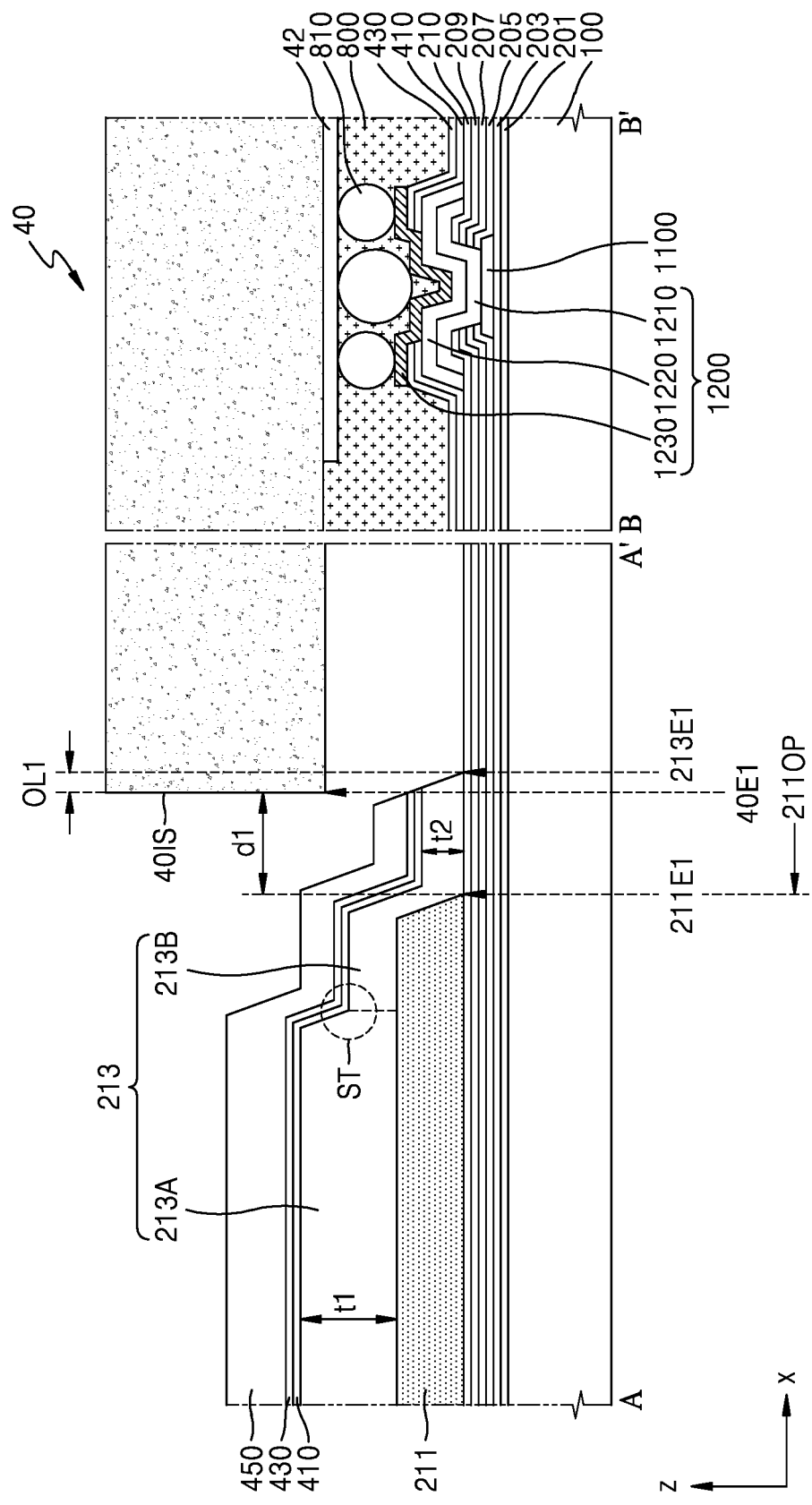
FIG. 8 is a cross-sectional view taken along the lines A-A' and B-B' of FIG. 7 according to some embodiments.
Figure 9:
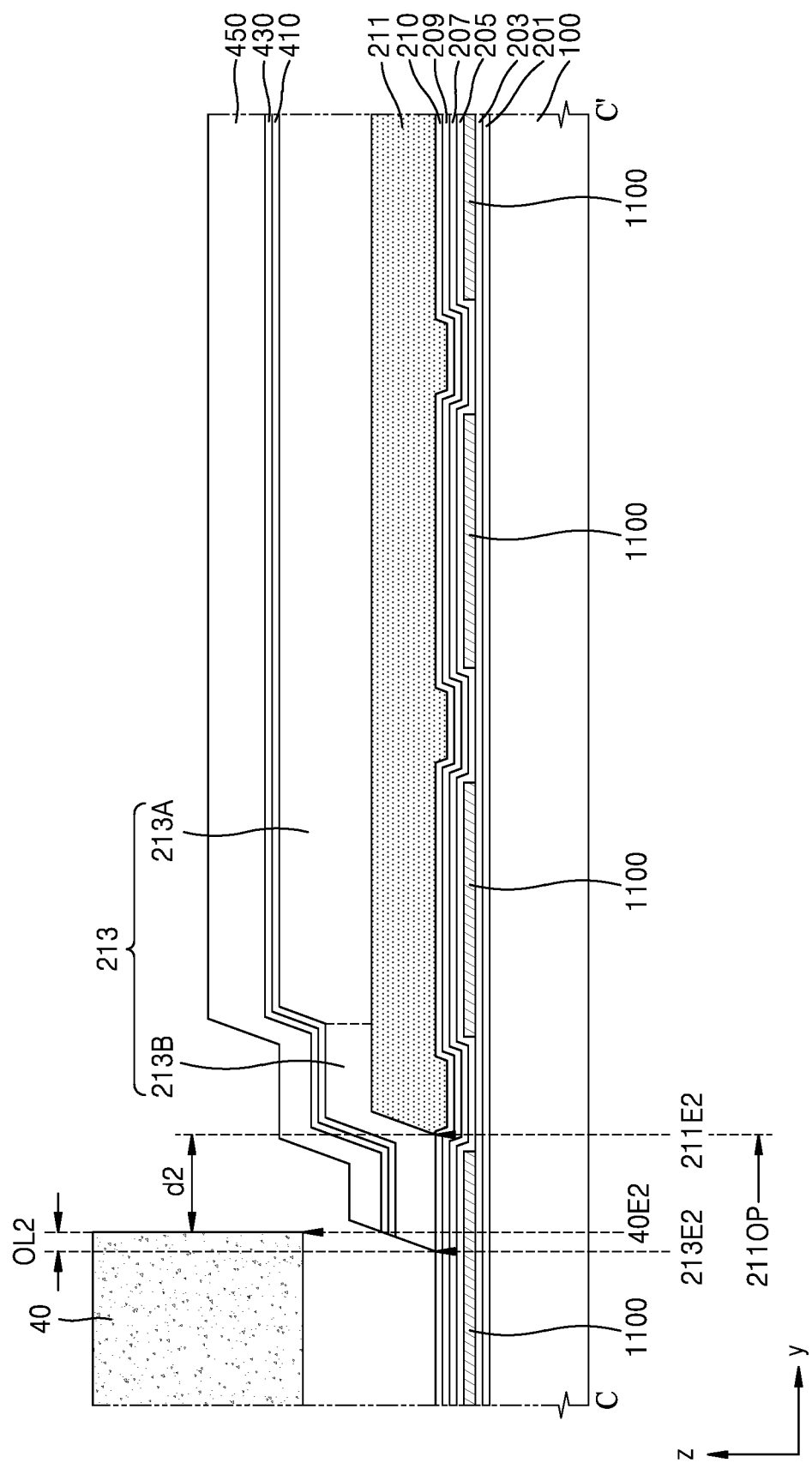
FIG. 9 is a cross-sectional view taken along the line C-C' of FIG. 7 according to some embodiments.

FIG. 7 is an enlarged plan view illustrating a portion VII of FIG. 5B. FIG. 8 is a cross-sectional view taken along the lines A-A' and B-B' of FIG. 7. FIG. 9 is a cross-sectional view taken along the line C-C' of FIG. 7.

Referring to FIG. 7, the integrated circuit 40 overlaps the pad electrodes 1200 located in the opening 211OP of the first organic insulating layer 211. The opening 211OP of the first organic insulating layer 211 is defined by edges of the first organic insulating layer 211 as described with reference to FIG. 5A, and FIG. 7 illustrates the first and second edges 211E1 and 211E2 of the first organic insulating layer 211.

Some of the pad electrodes 1200 may be connected to the connection line 1100, and the connection line 1100 may extend toward a display area away from the integrated circuit 40 as described above.

Referring to the cross-sectional view taken along the line A-A' of FIGS. 7 and 8, the first distance d between the first edge 211E1 of the first organic insulating layer 211 and the first edge 40E1 of the integrated circuit 40 may be about 40 µm or more as described above, and may range from about 40 µm to about 80 µm according to some embodiments.

Inorganic insulating layers on the substrate 100 may be located under the first organic insulating layer 211. According to some embodiments, in FIG. 8, the buffer layer 201, the first gate insulating layer 203, the first interlayer insulating layer 205, the second interlayer insulating layer 207, the second gate insulating layer 209, and the third interlayer insulating layer 210 are located between the substrate 100 and the first organic insulating layer 211.

The second organic insulating layer 213 may be located on the first organic insulating layer 211, and may extend past an edge of the first organic insulating layer 211 to the integrated circuit 40. In this regard, in FIG. 8, the second organic insulating layer 213 extends past the first edge 211E1 of the first organic insulating layer 211 to the integrated circuit 40, and thus, a first edge 213E1 of the second organic insulating layer 213 is closer to the integrated circuit 40 than the first edge 211E1 of the first organic insulating layer 211.

The second organic insulating layer 213 may include portions having different thicknesses. For example, the second organic insulating layer 213 may include a first portion 213A overlapping the first organic insulating layer 211 and a second portion 213B extending past an edge of the first organic insulating layer 211 to the integrated circuit 40. The second portion 213B is integrally formed with the first portion 213A.

A second thickness t2 of the second portion 213B may be less than a first thickness t1 of the first portion 213A, and a stepped portion ST may be formed on a connected portion between the first portion 213A and the second portion 213B. The second organic insulating layer 213 may be formed by using a halftone mask. The stepped portion ST may be located on a top surface of the first organic insulating layer 211.

The first thickness t1 of the first portion 213A of the second organic insulating layer 213 may be selected in a range from about 10,000 Å to about 20,000 Å. When the second portion 213B has the same thickness as the first thickness t1 of the first portion 213A, a vertical gap between the pad electrode 1200 and the integrated circuit 40 may increase as shown in the cross-sectional view taken along the line B-B' of FIG. 8, and in this case, a failure may occur in electrical connection between the pad electrode 1200 and the integrated circuit 40 using a conductive ball 810. However, according to some embodiments, because the second thickness t2 of the second portion 213B is less than the first thickness t1 of the first portion 213A, the above problem may be prevented or reduced.

The stepped portion ST between the first portion 213A and the second portion 213B is located opposite to the integrated circuit 40 with the edge of the first organic insulating layer 211 therebetween. For example, as shown in FIG. 8, the first edge 211E1 of the first organic insulating layer 211 may be located between the stepped portion ST and the integrated circuit 40. A distance between the stepped portion ST and the first edge 211E1 of the first organic insulating layer 211 may be equal or similar to the first distance d1. When a distance between the stepped portion ST and the first edge 211E1 of the first organic insulating layer 211 is similar to the first distance d1, it may mean that the distance is about 50% of the first distance d1 or corresponds to a range of about 150%. A distance between the stepped portion ST and the first edge 211E1 of the first organic insulating layer 211 may correspond to a distance between the first portion 213A of the second organic insulating layer 213 and the first edge 211E1 of the first organic insulating layer 211. Because the stepped portion ST between the first portion 213A and the second portion 213B may also be a portion on which stress may concentrate, it may be appropriate that the stepped portion ST is spaced apart from the integrated circuit 40. In this regard, in FIG. 8, the stepped portion ST is located farther from the integrated circuit 40 than the first edge 211E1 of the first organic insulating layer 211.

The second organic insulating layer 213 may partially overlap the integrated circuit 40. For example, the second portion 213B of the second organic insulating layer 213 may overlap the integrated circuit 40, to form a first overlapping area OL1. A width of the first overlapping area OL1 may be less than the first distance d1. For example, a width of the first overlapping area OL1 may be about 10 μm.

At least one of touch insulating layers of the input sensing layer 400 (see FIG. 4) described with reference to FIG. 4 may overlap the first organic insulating layer 211. According to some embodiments, in FIG. 8, the first touch insulating layer 410, the second touch insulating layer 430, and the third touch insulating layer 450 overlap the first organic insulating layer 211 and the second organic insulating layer 213.

The first touch insulating layer 410, the second touch insulating layer 430, and the third touch insulating layer 450 may be located on the second organic insulating layer 213. Each of the first touch insulating layer 410, the second touch insulating layer 430, and the third touch insulating layer 450 may extend past the edge of the first organic insulating layer 211 to the integrated circuit 40, like the second organic insulating layer 213. For example, as shown in FIG. 8, edges of the first touch insulating layer 410, the second touch insulating layer 430, and the third touch insulating layer 450 may be located on the second portion 213B of the second organic insulating layer 213 and may overlap the second portion 213B.

Although all of the first touch insulating layer 410, the second touch insulating layer 430, and the third touch insulating layer 450 are illustrated in FIG. 8, according to some embodiments, one or two of the first touch insulating layer 410, the second touch insulating layer 430, and the third touch insulating layer 450 may be omitted.

Referring to the cross-sectional view taken along the line B-B' of FIGS. 7 and 8, the pad electrode 1200 on the substrate 100 may be electrically connected to the connection line 1100 by contacting the connection line 1100.

The connection line 1100 may be located on the first gate insulating layer 203, and may include the same material as that of the lower electrode CE1 of the storage capacitor Cst and/or the first gate electrode GE1 described with reference to FIG. 4.

At least one insulating layer, for example, the first interlayer insulating layer 205, the second interlayer insulating layer 207, the second gate insulating layer 209, and the third interlayer insulating layer 210, may be located on the connection line 1100, and the pad electrode 1200 may be connected to the connection line 1100 through a contact hole passing through the first interlayer insulating layer 205, the second interlayer insulating layer 207, the second gate insulating layer 209, and the third interlayer insulating layer 210.

The pad electrode 1200 may have a structure in which a plurality of conductive layers are stacked. For example, as shown in FIG. 8, the pad electrode 1200 may include a first pad conductive layer 1210, a second pad conductive layer 1220, and a third pad conductive layer 1230.

The first pad conductive layer 1210 may include the same material as that of the node connection line 166 described with reference to FIG. 4. The second pad conductive layer 1220 may include the same material as that of the data line DL and/or the driving voltage line PL described with reference to FIG. 4. The third pad conductive layer 1230 may include the same material as that of the first conductive line 420 and/or the second conductive line 440 described with reference to FIG. 4. The third pad conductive layer 1230 may be connected to the second pad conductive layer 1220 through a contact hole formed in the first and second touch insulating layers 410 and 430.

Although the first pad conductive layer 1210 and the second pad conductive layer 1220 directly contact each other and an insulating layer (e.g., the first and second touch insulating layers 410 and 430) is located between the second pad conductive layer 1220 and the third pad conductive layer 1230 in FIG. 8, the disclosure is not limited thereto. According to some embodiments, an insulating layer (e.g., an organic insulating layer) may also be located between the first pad conductive layer 1210 and the second pad conductive layer 1220, and the first pad conductive layer 1210 and the second pad conductive layer 1220 may be connected to each other through a contact hole of the insulating layer.

The integrated circuit 40 may be electrically connected to the pad electrode 1200 by an anisotropic conductive film (ACF) 800 including the conductive ball 810. A bump 42 of the integrated circuit 40 may overlap the pad electrode 1200, the conductive ball 810 may be located between the bump 42 and the pad electrode 1200, and thus the bump 42 may be electrically connected to the pad electrode 1200.

Referring to the cross-sectional view taken along line C-C' of FIGS. 7 and 9, the second edge 211E2 of the first organic insulating layer 211 may be spaced apart from the second edge 40E2 of the integrated circuit 40, and the second distance d2 between the second edge 211E2 and the second edge 40E2 may range from about 40 μm to about 80 μm as described above.

The second organic insulating layer 213 may be located on the first organic insulating layer 211, and the second organic insulating layer 213 may extend past the second edge 211E2 of the first organic insulating layer 211 to the integrated circuit 40. A second edge 213E2 of the second organic insulating layer 213 may be closer to the integrated circuit 40 than the second edge 211E2 of the first organic insulating layer 211, like the first edge 213E1 of the second organic insulating layer 213. The second portion 213B of the second organic insulating layer 213 may overlap the integrated circuit 40, to form a second overlapping area OL2 as shown in FIG. 9. A width of the second overlapping area OL2, in other words, a distance between the second edge 213E2 of the second organic insulating layer 213 and the second edge 40E2 of the integrated circuit 40, may be less than the second distance d2. A width of the second overlapping area OL2 may be equal to or different from a width of the first overlapping area OL1 described with reference to FIG. 8. In some embodiments, a width of the second overlapping area OL2 may be about 10 μm.

The connection lines 1100 may be located between the substrate 100 and the first organic insulating layer 211 to be spaced apart from one another. As shown in FIGS. 7 and 9, portions of the connection lines 1100 may not overlap the first organic insulating layer 211. In other words, portions of the connection lines 1100 may overlap the opening 211OP of the first organic insulating layer 211. As such, portions of the connection lines 1100 may not be covered by or may not overlap the first organic insulating layer 211.

In a comparative example, when the second distance d2 between the second edge 211E2 of the first organic insulating layer 211 and the second edge 40E2 of the integrated circuit 40 exceeds about 80 μm, the area of a portion not overlapping the first organic insulating layer 211 may increase, and in this case, the connection line 1100 may be damaged by electrostatic discharge (ESD) and the quality of the connection line 1100 and surroundings thereof may be degraded.

With reference to FIGS. 8 and 9, the first and second edges 211E1 and 211E2 of the first organic insulating layer 211, the first and second edges 213E1 and 213E2 of the second organic insulating layer 213, and the first and second edges 40E1 and 40E2 of the integrated circuit 40 have been described. A structure between the third edge 211E3 of the first organic insulating layer 211, the third edge 213E3 of the second organic insulating layer 213, and the third edges 40E3 of the integrated circuit 40 described with reference to FIGS. 5A and 5B may be the same as that described with reference to FIG. 8. For example, the third distance d3 (see FIG. 5B) between the third edge 211E3 of the first organic insulating layer 211 and the third edge 40E3 of the integrated circuit 40 may be about 40 μm or more, and may range from about 40 μm to about 80 μm according to some embodiments. The second organic insulating layer 213 may extend past the third edge 211E3 of the first organic insulating layer 211 to form a third overlapping area with the integrated circuit 40. A width of the third overlapping area may be equal to or different from a width of the first overlapping area OL1 and/or the second overlapping area OL2. The second organic insulating layer 213 may include a first portion and a second portion having different thicknesses, and a description thereof is the same as that described with reference to FIG. 8.

A structure between the fourth edge 211E4 of the first organic insulating layer 211, the fourth edge 213E4 of the second organic insulating layer 213, and the fourth edges 40E4 of the integrated circuit 40 described with reference to FIGS. 5A and 5B is the same as that described with reference to FIG. 9. For example, the fourth distance d4 (see FIG. 5B) between the fourth edge 211E4 of the first organic insulating layer 211 and the fourth edge 40E4 of the integrated circuit 40 may be about 40 μm or more, and may range from about 40 μm to about 80 μm according to some embodiments. The second organic insulating layer 213 may extend past the fourth edge 211E4 of the first organic insulating layer 211 to form a fourth overlapping area with the integrated circuit 40. A width of the fourth overlapping area may be equal to or different from a width of the first overlapping area OL1 and/or the second overlapping area OL2. The second organic insulating layer 213 may include a first portion and a second portion having different thicknesses, and a description thereof is the same as that described with reference to FIG. 9.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display device comprising:
   a display area having a plurality of sub-pixels;
   a plurality of pad electrodes in a peripheral area outside the display area;
   a first organic insulating layer comprising an opening overlapping the plurality of pad electrodes;
   an integrated circuit overlapping the plurality of pad electrodes and electrically connected to the plurality of pad electrodes,
   wherein a distance between an edge of the first organic insulating layer defining the opening and an edge of the integrated circuit is about 40 micrometers (μm) or more,
   wherein the distance ranges from about 40 μm to about 80 μm;
   a plurality of data lines passing through the display area; and
   a plurality of connection lines electrically connecting the plurality of data lines to the plurality of pad electrodes.

2. The display device of claim 1, further comprising a second organic insulating layer on the first organic insulating layer,
   wherein the second organic insulating layer extends past the edge of the first organic insulating layer to overlap a part of the integrated circuit.

3. The display device of claim 2, wherein the second organic insulating layer comprises:
   a first portion overlapping the first organic insulating layer; and
   a second portion extending past the edge of the first organic insulating layer to overlap a part of the integrated circuit,
   wherein a thickness of the second portion is less than a thickness of the first portion.

4. The display device of claim 3, wherein the second organic insulating layer comprises a connection portion between the first portion and the second portion, the connection portion of the second organic insulating layer comprising a stepped portion, wherein the stepped portion is on a top surface of the first organic insulating layer.

5. The display device of claim 1, wherein some of the plurality of connection lines overlap the opening of the first organic insulating layer.

6. The display device of claim 3, further comprising a touch input layer comprising a plurality of touch electrodes and a touch insulating layer in the display area,
   wherein the touch insulating layer overlaps the second organic insulating layer.

7. The display device of claim 6, wherein the touch insulating layer overlaps the second portion of the second organic insulating layer.

8. The display device of claim 6, wherein the touch insulating layer comprises at least one of an organic insulating material or an inorganic insulating material.

9. The display device of claim 1, wherein the plurality of sub-pixels emit light by using a light-emitting diode on a substrate,
   wherein a part of the first organic insulating layer is between the substrate and the light-emitting diode.

10. A display device comprising:
a display area having a plurality of sub-pixels;
a plurality of signal lines in the display area;
a plurality of pad electrodes in a peripheral area outside the display area and electrically connected to the plurality of signal lines;
a first organic insulating layer comprising an opening overlapping the plurality of pad electrodes;
a second organic insulating layer on the first organic insulating layer; and
an integrated circuit overlapping the plurality of pad electrodes and electrically connected to the plurality of pad electrodes,
wherein an edge of the first organic insulating layer defining the opening is outside the integrated circuit to be spaced apart from an edge of the integrated circuit,
wherein a distance between the edge of the first organic insulating layer and the edge of the integrated circuit ranges from about 40 micrometers ($\mu$m) to about 80 $\mu$m.

11. The display device of claim 10, wherein the second organic insulating layer extends past the edge of the first organic insulating layer to overlap a part of the integrated circuit.

12. The display device of claim 10, wherein the second organic insulating layer comprises:
a first portion overlapping the first organic insulating layer; and
a second portion extending past the edge of the first organic insulating layer to overlap a part of the integrated circuit,
wherein a thickness of the second portion is less than a thickness of the first portion.

13. The display device of claim 12, wherein the second organic insulating layer comprises a connected portion between the first portion and the second portion, the connected portion of the second organic insulating layer comprises a stepped portion,
wherein the stepped portion is opposite the edge of the integrated circuit with the edge of the first organic insulating layer therebetween.

14. The display device of claim 10, further comprising a plurality of connection lines electrically connecting data lines of the display area to the plurality of pad electrodes of the peripheral area,
wherein the plurality of connection lines are under the first organic insulating layer.

15. The display device of claim 14, wherein some of the plurality of connection lines overlap the opening of the first organic insulating layer.

16. The display device of claim 10, wherein the plurality of sub-pixels are configured to emit light by using a light-emitting diode on a substrate,
wherein each of a part of the first organic insulating layer and a part of the second organic insulating layer is between the substrate and the light-emitting diode.

17. The display device of claim 10, further comprising a touch input layer comprising a plurality of touch electrodes and a touch insulating layer in the display area,
wherein the touch insulating layer overlaps the first organic insulating layer and the second organic insulating layer.

* * * * *